United States Patent
Kotani

(10) Patent No.: US 9,257,591 B2
(45) Date of Patent: Feb. 9, 2016

(54) PHOTOCOUPLER SEMICONDUCTOR DEVICE

(71) Applicant: KABUSHIKI KAISHA TOSHIBA, Minato-ku, Tokyo (JP)

(72) Inventor: Toshiyuki Kotani, Fukuoka-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 200 days.

(21) Appl. No.: 13/845,287

(22) Filed: Mar. 18, 2013

(65) Prior Publication Data

US 2014/0061678 A1 Mar. 6, 2014

(30) Foreign Application Priority Data

Aug. 28, 2012 (JP) ................................. 2012-187624

(51) Int. Cl.
*H01L 31/16* (2006.01)
*H01L 31/173* (2006.01)
*H01L 31/167* (2006.01)

(52) U.S. Cl.
CPC ............ *H01L 31/165* (2013.01); *H01L 31/167* (2013.01)

(58) Field of Classification Search
USPC ..................... 257/82, 113, 116, 459, E31.103, 257/E31.109
See application file for complete search history.

(56) References Cited

U.S. PATENT DOCUMENTS

| | | | | |
|---|---|---|---|---|
| 4,712,017 A | * | 12/1987 | Kamasaki | 250/551 |
| 4,794,441 A | * | 12/1988 | Sugawara et al. | 257/124 |
| 5,647,034 A | * | 7/1997 | Matsuda et al. | 385/16 |
| 6,025,610 A | * | 2/2000 | Kusaka | H01L 31/16 257/113 |
| 2004/0241927 A1 | * | 12/2004 | Kato et al. | 438/202 |
| 2007/0040108 A1 | * | 2/2007 | Wenstrand | 250/221 |
| 2007/0086708 A1 | * | 4/2007 | Nojima | H01L 31/167 385/88 |
| 2008/0290477 A1 | * | 11/2008 | Muramatsu | H01L 23/49562 257/666 |
| 2009/0129724 A1 | * | 5/2009 | Carter et al. | 385/14 |

FOREIGN PATENT DOCUMENTS

| | | |
|---|---|---|
| JP | S61-95581 A | 5/1986 |
| JP | S61-241986 A | 10/1986 |
| JP | H09-223791 A | 8/1997 |
| JP | 2006-005102 A | 1/2006 |

OTHER PUBLICATIONS

Office Action mailed Jan. 27, 2015 issued in corresponding JP patent application No. 2012-187624 (and English translation).

* cited by examiner

*Primary Examiner* — Mary Wilczewski
*Assistant Examiner* — Tsz Chiu
(74) *Attorney, Agent, or Firm* — Posz Law Group, PLC

(57) ABSTRACT

According to an embodiment, a semiconductor device includes a primary side lead, a light-emitting element electrically connected to the primary side lead, and a thyristor-type light-receiving element. The light-receiving element includes a first face for detecting light emitted from the light-emitting element, and a second face provided on an opposite side of the first face. The light-receiving element includes an anode electrode, a cathode electrode, and a gate electrode that are provided on the first face. The device further includes a secondary side first lead electrically connected to the anode electrode, a secondary side second lead electrically connected to the cathode electrode, and a secondary side third lead electrically connected to the gate electrode. The secondary side third lead is connected to the second face of the light-receiving element.

14 Claims, 4 Drawing Sheets

PHOTOCOUPLER SEMICONDUCTOR DEVICE

CROSS-REFERENCE TO RELATED APPLICATIONS

This application is based upon and claims the benefit of priority from Japanese Patent Application No.2012-187624, filed on Aug. 28, 2012; the entire contents of which are incorporated herein by reference.

FIELD

Embodiments are generally related to a semiconductor device.

BACKGROUND

A photocoupler is a semiconductor device, which transmits a signal via optical coupling between a light-emitting element and a light-receiving element that are built in a package. A primary side lead connected to the light-emitting element and a secondary side lead connected to the light-receiving element are electrically insulated so that, for example, a low-voltage circuit connected to the primary side can control a high-voltage circuit on the secondary side.

The photocoupler used in such manner may employ, as the light-receiving element, a thyristor that is turned on by photocurrent, for example. The thyristor generally has a vertical structure in which current flows from an electrode on a front face side to an electrode on a back face side, and satisfies a peak forward blocking voltage of 400 V to 600 V required for the design, for example. However, a process of manufacturing the thyristor having the vertical structure includes a lengthy impurity diffusion process, requiring a long turnaround time to be completed. As a result, the whole process of manufacturing the photocoupler including the process of manufacturing the thyristor would have a long lead time, resulting in a low manufacturing efficiency. Thus, there is required a photocoupler using a thyristor in a lateral structure that has a shorter time of the manufacturing process.

DETAILED DESCRIPTION

Figure 1A:
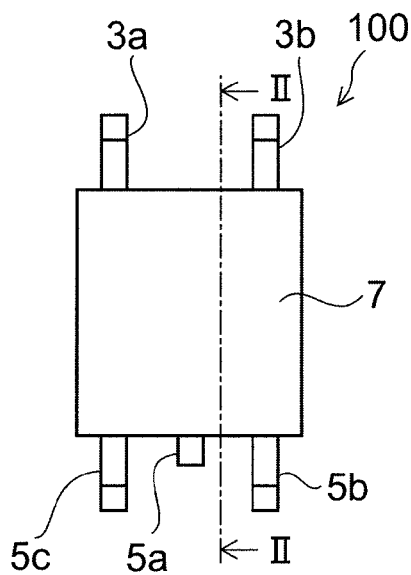
FIGS. 1A to 1C are schematic views illustrating the exterior of a semiconductor device according to an embodiment.

According to an embodiment, a semiconductor device includes a primary side lead, a light-emitting element electrically connected to the primary side lead, and a thyristor-type light-receiving element. The light-receiving element includes a first face for detecting light emitted from the light-emitting element, and a second face provided on an opposite side of the first face. The light-receiving element includes an anode electrode, a cathode electrode, and a gate electrode that are provided on the first face. The device further includes a secondary side first lead electrically connected to the anode electrode, a secondary side second lead electrically connected to the cathode electrode, and a secondary side third lead electrically connected to the gate electrode. The secondary side third lead is connected to the second face of the light-receiving element.

An embodiment will now be described with reference to the drawings. Note that in the drawings, the same reference numeral is given to the same part, the detailed description of which will be omitted as appropriate, and a part different among the drawings will be described.

Figure 1B:
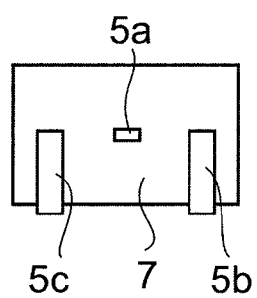
Figure 1C:
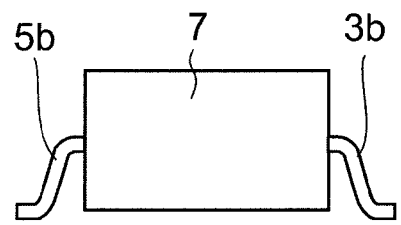

FIGS. 1A to 1C are schematic views illustrating the exterior of a semiconductor device 100 according to the embodiment. FIG. 1A shows an upper face of a package (hereinafter referred to as a molded body 7), and each of FIG. 1B and FIG. 1C shows a side face of the molded body 7.

Figure 2:
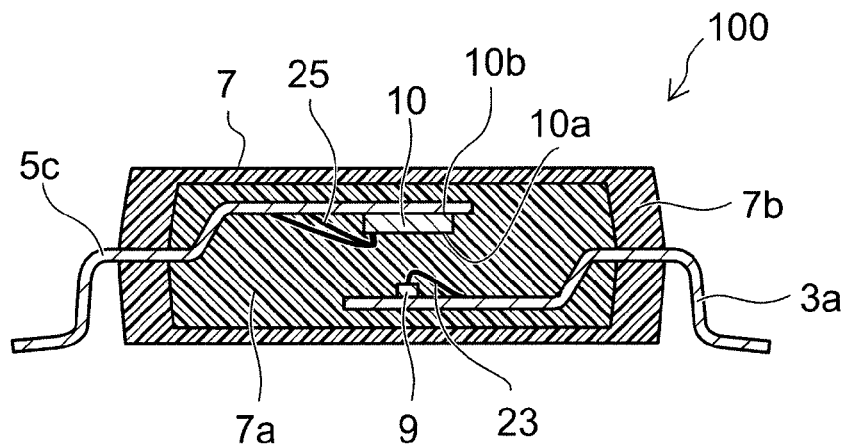
FIG. 2 is a schematic cross-sectional view illustrating the semiconductor device according to the embodiment.

The semiconductor device 100 is a photocoupler in which a light-emitting element 9 and a light-receiving element 10 are included inside the molded body 7 (refer to FIG. 2). The light-emitting element 9 is a light emitting diode (LED), for example, and the light-receiving element 10 is a photothyristor, for example.

The light-emitting element 9 is electrically connected to primary side leads 3a and 3b, whereas the light-receiving element 10 is electrically connected to secondary side leads 5a to 5c. As shown in FIG. 1A, the primary side leads 3a and 3b extend out from one side face of the molded body 7, and the secondary side leads 5a to 5c extend out from a side face opposite to the one side face from which the primary side leads 3a and 3b extend.

In the case where the light-receiving element 10 is the photothyristor, a first lead is an anode terminal shown as the lead 5 on the secondary side, as a second lead is a cathode terminal shown as the lead 5b on the secondary side, and a third lead is a gate terminal shown the lead 5c on the secondary side, for example.

FIG. 2 is a schematic cross-sectional view of the semiconductor device 100, illustrating a cross-sectional structure thereof taken along line in FIG. 1A.

The molded body 7 has a double structure including a transparent resin 7a and a light-shielding resin 7b provided around the transparent resin 7a, for example. The molded body 7 has built therein the light-emitting element 9 and the light-receiving element 10 that are sealed by the transparent resin 7a. The transparent resin 7a transmits light emitted from the light-emitting element 9 to allow optical coupling between the light-emitting element 9 and the light-receiving element 10. The light-shielding resin 7b intercepts light in a wavelength range that is sensed by the light-receiving element 10 to improve sensitivity of the light-receiving element 10. As a result, the light-receiving element 10 can be prevented from a malfunction.

The light-emitting element 9 is bonded to a tip of the lead 3a via a conductive paste, for example. The light-emitting element 9 is then electrically connected to the lead 3b via a metal wire 23. The primary side leads 3a and 3b have a portion connected to the light-emitting element 9 and sealed inside the molded body 7, and a portion extending out from the molded body 7.

The light-receiving element 10 has a first face 10a for detecting light emitted from the light-emitting element 9 and a second face 10b provided on an opposite side of the first face 10a. The second face 10b is faced toward the lead 5c and bonded to a tip thereof. In addition, the light-receiving element 10 is electrically connected to the other secondary side leads 5a and 5b via a metal wire 25. The secondary side leads 5a to 5c also have a portion connected to the light-receiving element 10 and sealed inside the molded body 7, and a portion extending out from the molded body 7.

The light-emitting element 9 and the light-receiving element 10 are disposed such that, for example, the first face 10a of the light-receiving element 10 faces the light-emitting element 9, thereby improving the optical coupling efficiency between the light-emitting element 9 and the light-receiving element 10.

In a process of manufacturing the semiconductor device 100, for example, a lead frame mounted with the light-emitting element 9 and a lead frame mounted with the light-receiving element 10 are combined to mold the transparent resin 7a by means of an injection molding method. Moreover, the light-shielding resin 7b is molded around the transparent resin 7a to form the molded body 7. Each lead extending out from the molded body 7 is then cut and isolated from the lead frame to complete the semiconductor device 100.

An epoxy resin, a silicone resin or the like can be used for the transparent resin 7a, for example. The light-shielding resin 7b is made of a black resin in which a light absorber such as carbon is dispersed, or a white resin in which a reflector such as titanium oxide powder is dispersed, for example. Moreover, a principal component of the transparent resin 7a and the light-shielding resin 7b is favorably the same so that the adhesion between the transparent resin 7a and the light-shielding resin 7b can be improved.

Figure 3A:
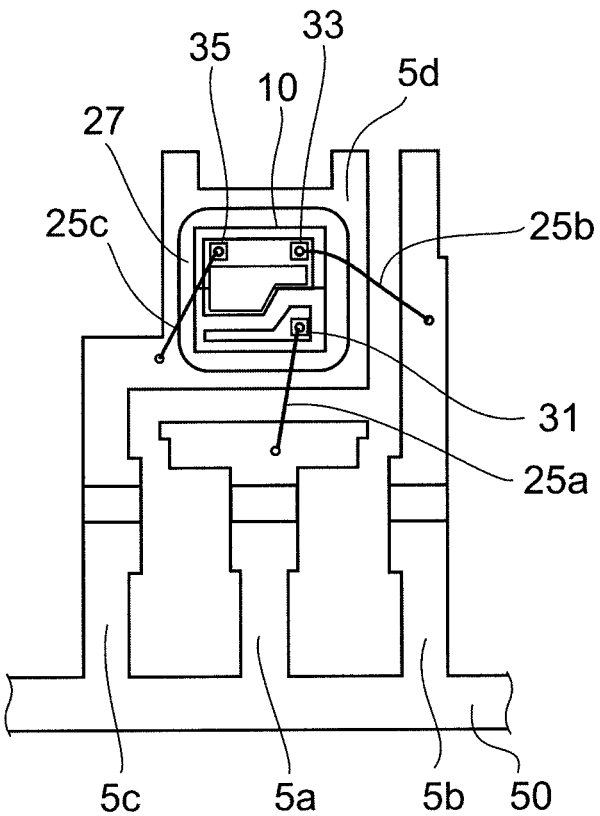
FIGS. 3A and 3B are schematic views illustrating a light-receiving element assembled on a lead frame according the embodiment.
Figure 3B:
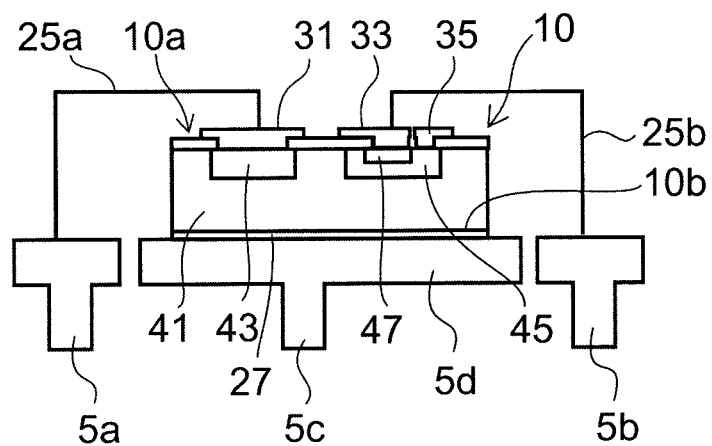

FIGS. 3A and 3B are schematic views showing a mounting example of the light-receiving element 10 according the embodiment. That is, FIG. 3A is a plan view of the light-receiving element 10 being mounted to a lead frame 50, and FIG. 3B is a cross-sectional view showing the wire connection between each lead and the light-receiving element 10.

As shown in FIG. 3A, the light-receiving element 10 is bonded (die-bonded) to a mount bed 5d provided at a tip of the lead 5c via an insulator 27, for example. The light-receiving element 10 has an anode electrode 31, a cathode electrode 33, and a gate electrode 35 on the first face 10a thereof.

For example, the lead 5a is electrically connected to the anode electrode 31 via a metal wire 25a. Moreover, the lead 5b is electrically connected to the cathode electrode 33 via a metal wire 25b. Furthermore, the lead 5c is connected to the second face 10b of the light-receiving element 10 via the insulator 27 and electrically connected to the gate electrode 35 via a metal wire 25c.

Figure 5A:
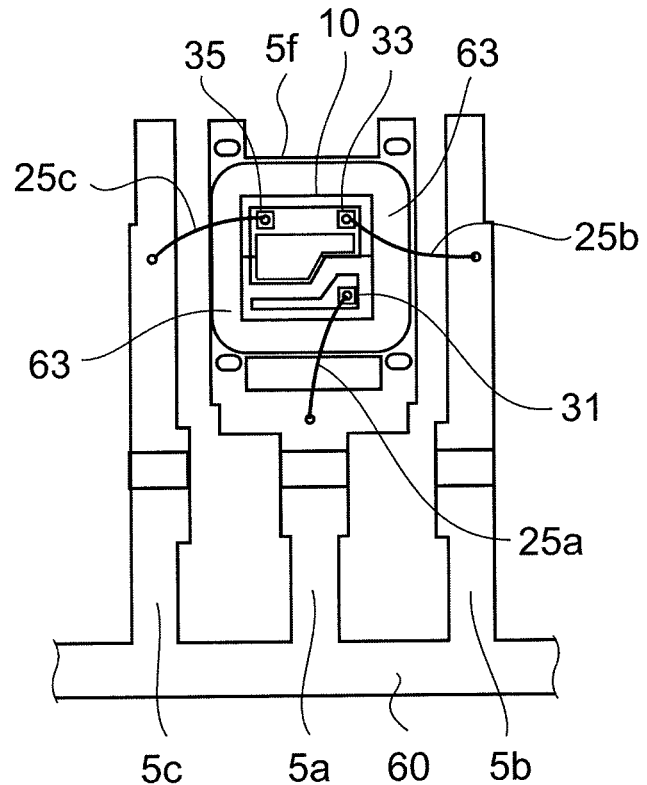
FIGS. 5A and 5B are schematic views illustrating a light-receiving element assembled on a lead frame according to a comparative example.
Figure 5B:
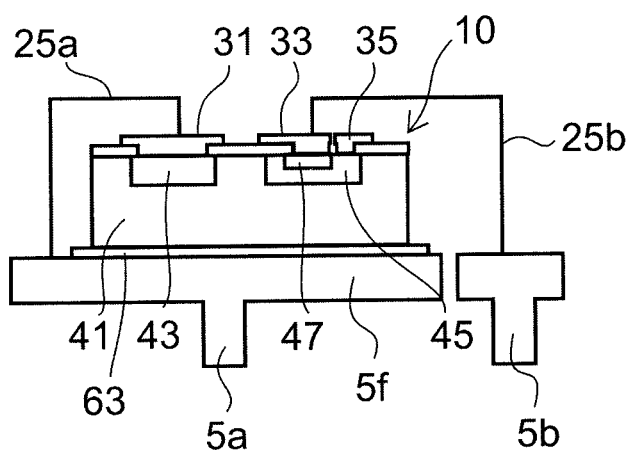

FIGS. 5A and 5B are schematic views showing the light-receiving element 10 assembled on a lead frame 60 according to a comparative example. FIG. 5A is a plan view of the light-receiving element 10 being mounted to a lead frame 60, and FIG. 5B is a cross-sectional view showing the connection between each lead and the light-receiving element 10.

As shown in FIG. 5A, the lead frame 60 has a mount bed 5f at a tip of the lead 5a that serves as the anode terminal, and is suitable for mounting a photothyristor in a vertical structure that has an anode electrode on a back face of a chip, for example.

When the light-receiving element 10 being a photothyristor in a lateral structure is to be mounted on the lead frame 60, the light-receiving element 10 is first die-bonded onto the mount bed 5f via an insulator 63. The anode electrode 31 of the light-receiving element 10 is then electrically connected to the lead 5a via the metal wire 25a. On the other hand, the cathode electrode 33 is electrically connected to the lead 5b via the metal wire 25b. Moreover, the gate electrode 35 is electrically connected to the lead 5c via the metal wire 25c.

As shown in FIG. 5B, in the light-receiving element 10, the anode electrode 31 is in contact with a p-type region 43 provided on an n-type semiconductor layer 41. On the other hand, the cathode electrode 33 is in contact with an n-type region 47 provided on a p-type region 45. The p-type region 45 is provided on the n-type semiconductor layer 41 while being separated from the p-type region 43. The light-receiving element 10 thus has a pnpn thyristor structure provided in a lateral direction between the anode electrode 31 and the cathode electrode 33.

For example, let us say that the lead 5b is connected to ground and AC voltage is applied between the lead 5a and the lead 5b. While a positive voltage is being applied to the lead 5a (the anode electrode 31), a p-n junction between the p-type region 43 and the n-type semiconductor layer 41 is in a forward direction, a p-n junction between the n-type semiconductor layer 41 and the p-type region 45 is in a reverse direction, and a p-n junction between the p-type region 45 and the n-type region 47 is in a forward direction. Therefore, the positive voltage is maintained by the p-n junction between the n-type semiconductor layer 41 and the p-type region 45.

On the other hand, while a negative voltage is being applied to the lead 5a, the p-n junction between the p-type region 43 and the n-type semiconductor layer 41 is in a reverse direction, the p-n junction between the n-type semiconductor layer 41 and the p-type region 45 is in a forward direction, and the p-n junction between the p-type region 45 and the n-type region 47 is in a reverse direction. Therefore, the negative voltage is maintained by the p-n junction between the p-type region 43 and the n-type semiconductor layer 41 and by the p-n junction between the p-type region 45 and the n-type region 47. At this time, the difference in voltage between the lead 5a and the semiconductor layer 41 is maintained by the insulator 63. Therefore, a withstand voltage is increased by thickening the insulator 63 when a peak value of the AC voltage is high.

For example, a thickness of the insulator 63 would be 10 micrometers ($\mu m$) or more when the peak value on the negative side is 600 V. When the light-receiving element 10 is die-bonded via such thick insulator 63, a chip face may be slanted, possibly making it difficult to perform wire bonding thereafter.

In the embodiment, on the other hand, the light-receiving element 10 is die-bonded onto the lead 5c that serves as the gate terminal. As a result, there would not be a large potential difference generated between the semiconductor layer 41 and the lead 5c by the high voltage applied between the lead 5a and the lead 5b, so that the insulator 27 provided between the light-receiving element 10 and the lead 5c can be made thinner than the insulator 63. That is, the light-receiving element 10 can be directly die-bonded onto the lead 5c by using, for example, an insulating adhesive without interposing a thick resin such as polyimide. Accordingly, the manufacturing efficiency can be improved. Moreover, the slanting of the chip face would be suppressed, thereby facilitating the wire bonding to each electrode.

Now, a configuration of the light-receiving element 10 according to the embodiment will be described with reference to FIG. 4.

Figure 4:
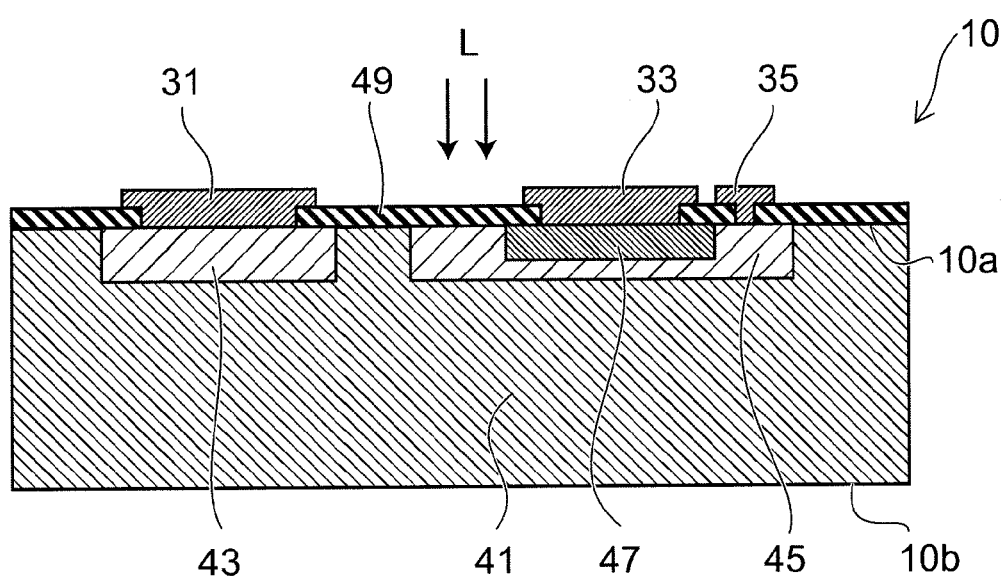
FIG. 4 is a schematic cross-sectional view illustrating the light-receiving element according to the embodiment.

As shown in FIG. 4, the light-receiving element 10 has the n-type semiconductor layer 41, and the p-type region 43 (a first region) and the p-type region 45 (a second region) that are selectively provided on the n-type semiconductor layer 41. The p-type region 43 and the p-type region 45 are mutually separated. The light-receiving element 10 further has the n-type region 47 (a third region) selectively provided on the p-type region 45.

Here, the front face of the n-type semiconductor layer 41 is the first face 10a and the back face of the n-type semiconductor layer 41 is the second face 10b. On the first face 10a, the anode electrode 31 is connected to the p-type region 43, and the cathode electrode 33 is connected to the n-type region 47. As a result, the pnpn thyristor structure is provided between the anode electrode 31 and the cathode electrode 33. In addition, a surface protection film 49 made of a silicon oxide film or the like is provided on the first face 10a. Although connected to the p-type region 45 in FIG. 4A, the gate electrode 35 may also be connected to the n-type semiconductor layer 41.

The n-type semiconductor layer 41 is an n-type silicon layer provided on a silicon substrate, for example, or may also be an n-type silicon substrate. The p-type regions 43 and 45 are several μm deep, for example, and can be formed by ion implantation. The p-type regions can also be formed by thermal diffusion of a p-type impurity, which can be performed in a short period of time and can cut down the manufacturing lead time.

A first conductivity type is made to be the n type and a second conductivity type to be the p type in the light-receiving element 10 in FIG. 4; however, the first conductivity type may be the p type and the second conductivity type may be the n type. In this case, the electrode 31 in contact with the first region would be the cathode electrode, and the electrode 33 in contact with the third region would be the anode electrode.

In the light-receiving element 10, an emitted light L from the light-emitting element 9 is detected by the p-type region 45, for example. In this case, the detection of light refers to turning on the thyristor between the anode electrode 31 and the cathode electrode 33 upon receiving the irradiation with light. The emitted light L can also be detected by the n-type semiconductor layer 41 between the p-type region 43 and the p-type region 45.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a primary side lead;
    a plurality of secondary side leads;
    a light-emitting element electrically connected to the primary side lead; and
    a light-receiving element of a thyristor-type configured to receive a light emitted by the light-emitting element, the light receiving element including:
        a first face for detecting light emitted from the light-emitting element;
        a second face provided on an opposite side of the first face; and
        an anode electrode, a cathode electrode, and a gate electrode that are provided on the first face;
    a first lead of the secondary side leads being electrically connected to the anode electrode;
    a second lead of the secondary side leads being electrically connected to the cathode electrode; and
    a third lead of the secondary side leads being electrically connected to the gate electrode and having a mounting portion, the light receiving element being mounted on the mounting portion via an electrical insulator that is provided on the second face of the light-receiving element.

2. The device according to claim 1,
    wherein the light-receiving element includes:
        a semiconductor layer of a first conductivity type;
        a first region of a second conductivity type selectively provided on the semiconductor layer;
        a second region of a second conductivity type selectively provided on the semiconductor layer and separated from the first region; and
        a third region of a first conductivity type selectively provided on the second region,
    the anode electrode is connected to one of the first region and the third region,
    the cathode electrode is connected to the other of the first region and the third region, and
    the gate electrode is connected to one of the second region and the semiconductor layer.

3. The device according to claim 2, wherein the light-receiving element detects light emitted from the light-emitting element in the semiconductor layer between the first region and the second region or in the second region.

4. The device according to claim 1, wherein the anode electrode is connected to the first lead via a metal wire, and the cathode electrode is connected to the second lead via a metal wire.

5. The device according to claim 1, wherein the gate electrode is provided on the first face and is connected to the third lead via a metal wire.

6. The device according to claim 1, wherein the light-emitting element and the light-receiving element are disposed such that the first face of the light-receiving element faces the light-emitting element.

7. The device according to claim 1, further comprising a molded body for covering the light-emitting element, a portion of the primary side lead connected to the light-emitting element, the light-receiving element, and a portion of each of the first lead, the second lead, and the third lead connected to the light-receiving element.

8. The device according to claim 7, wherein the molded body includes a transparent resin for covering the light-emitting element and the light-receiving element and transmitting light from the light-emitting element, and a light-shielding resin for covering the transparent resin and intercepting light in a wavelength range that is sensed by the light-receiving element.

9. The device according to claim 8, wherein the transparent resin includes at least one of an epoxy resin and a silicone resin.

10. The device according to claim 8, wherein the light-shielding resin includes a light absorber or a reflector.

11. The device according to claim 8, wherein a principal component of the transparent resin is a same as a principal component of the light-shielding resin.

12. The device according to claim 7, wherein each of the primary side lead, the first lead, the second lead, and the third lead includes a portion extending out from the molded body.

13. The device according to claim 12, wherein the primary side lead extends out from one side face of the molded body, and the plurality of secondary side leads extend out from a side face on an opposite side of the one side face.

14. The device according to claim 1, wherein the anode electrode is electrically connected to the first lead by wiring, the cathode electrode is electrically connected to the second lead by wiring, and the gate electrode is electrically connected to the third lead by wiring.

* * * * *